US007136003B1

(12) United States Patent
Ripley et al.

(10) Patent No.: US 7,136,003 B1
(45) Date of Patent: Nov. 14, 2006

(54) CLOCKLESS PULSE SHAPING CIRCUIT FOR CONTROLLING A POWER AMPLIFIED OUTPUT

(75) Inventors: David S. Ripley, Cedar Rapids, IA (US); Wayne L. Edwards, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 27 days.

(21) Appl. No.: 10/979,967

(22) Filed: Nov. 2, 2004

(51) Int. Cl.
*H03M 1/66* (2006.01)

(52) U.S. Cl. ...................... 341/147; 341/144
(58) Field of Classification Search ......... 341/144–154
See application file for complete search history.

(56) References Cited

U.S. PATENT DOCUMENTS 6,462,688 B1 * 10/2002 Sutardja .................... 341/144

* cited by examiner

*Primary Examiner*—Lam T. Mai
(74) *Attorney, Agent, or Firm*—Farjami & Farjami LLP

(57) ABSTRACT

According to an exemplary embodiment, a circuit includes a power amplifier configured to generate an RF output signal. The circuit further includes a pulse shaping circuit coupled to the power amplifier, where the pulse shaping circuit is configured to receive a digital input signal and generate an analog output signal at a first node, and where the analog output signal controls the RF output signal. The analog output signal has a ramp-up portion having a first shape, where the first shape corresponds to a piece-wise-linear approximation of a sinusoid. The analog output signal also has a ramp-down portion having a second shape, where the second shape corresponds to the piece-wise-linear approximation of a sinusoid. The pulse shaping circuit does not require a clock reference to generate the analog output signal.

15 Claims, 3 Drawing Sheets

CLOCKLESS PULSE SHAPING CIRCUIT FOR CONTROLLING A POWER AMPLIFIED OUTPUT

BACKGROUND OF THE INVENTION

1. Field of the Invention

The present invention is generally in the field of electrical circuits. More specifically, the invention is in the field of power amplifiers.

2. Related Art

Wireless communication devices, such as wireless communication system using time-division multiplexing ("TDM") communication standard, transmit information in power bursts, which are generated by pulsing a power amplifier. These systems require pulse shaping to minimize undesirable switching transients, which can occur when the power amplifier output is abruptly ramped up to a high power level at the beginning of the power burst and abruptly ramped down at the end of the power burst. The shape of the transmit pulse, i.e. the power burst, can be controlled by adjusting the gain of the power amplifier as a function of time, for example.

In a typical conventional approach, a digital-to-analog converter ("DAC") is used to control the power amplifier gain and construct a desired pulse shape. However, since the DAC control is digital in nature, it, i.e. the DAC control, requires memory space and clocked reference signals, which can generate undesirable harmonic energy that can interference with radio frequency ("RF") signals in the power amplifier. Also, the DAC generates a stepped output that must be filtered to eliminate undesirable spectrum content, which is caused by the discrete nature of the DAC output waveform.

Additionally, significant differences exist in the gain control characteristics of power amplifiers provided by different vendors as well as from different generations of power amplifiers. Also, since the DAC and power amplifier are typically provided by a different vendor than the power amplifier, the waveform that comes out of the DAC is not necessarily compatible with the waveform required to drive the power amplifier. As a result, the DAC output waveform must be modified to meet the particular requirements of each power amplifier.

Thus, there is a need in the art for an effective pulse shaping circuit for a power amplifier in a wireless communication system, such as a TDM system.

SUMMARY OF THE INVENTION

The present invention is directed to clockless pulse shaping circuit for controlling a power amplifier output. The present invention addresses and resolves the need in the art for an effective pulse shaping circuit for a power amplifier in a wireless communication system, such as a TDM system.

According to an exemplary embodiment, a circuit includes a power amplifier configured to generate an RF output signal. The circuit further includes a pulse shaping circuit coupled to the power amplifier, where the pulse shaping circuit is configured to receive a digital input signal and generate an analog output signal at a first node, and where the analog output signal controls the RF output signal. The analog output signal has a ramp-up portion having a first shape, where the first shape corresponds to a piece-wise-linear approximation of a sinusoid. The analog output signal also has a ramp-down portion having a second shape, where the second shape corresponds to the piece-wise-linear approximation of a sinusoid. The pulse shaping circuit does not require a clock reference to generate the analog output signal. The power amplifier and the pulse shaping circuit may be combined in a single IC, for example.

According to this exemplary embodiment, the pulse shaping circuit includes a buffer configured to receive the digital input signal and drive a number of current sources, where the current sources determines the first shape of the ramp-up portion of the analog output signal. Each of the current sources can be a PFET, for example. The pulse shaping circuit further includes an integration capacitor, where each of the current sources are configured to be selectively coupled to and selectively decoupled from the integration capacitor. The ramp-down portion of the analog output signal can be generated by sequentially draining current off of the integration capacitor. Other features and advantages of the present invention will become more readily apparent to those of ordinary skill in the art after reviewing the following detailed description and accompanying drawings.

DETAILED DESCRIPTION OF THE INVENTION

The present invention is directed to clockless pulse shaping circuit for controlling a power amplifier output. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
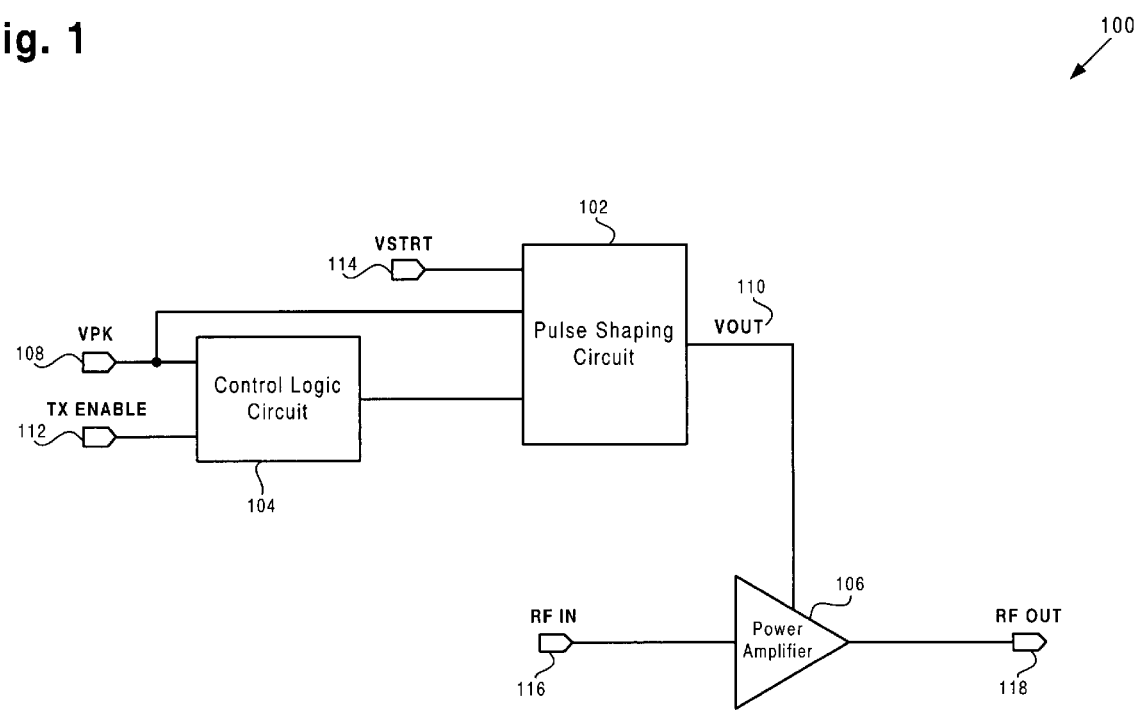
FIG. 1 is a block diagram of an exemplary pulse shaping circuit coupled to an exemplary power amplifier in accordance with one embodiment of the present invention.

FIG. 1 shows a block diagram of an exemplary circuit including an exemplary pulse shaping circuit, an exemplary control logic module, and an exemplary power amplifier in accordance with one embodiment of the present invention. Certain details and features have been left out of FIG. 1, which are apparent to a person of ordinary skill in the art. Circuit 100 includes pulse shaping circuit 102, control logic module 104, and power amplifier 106.

Circuit 100 can be used in wireless communication devices, such as cellular handsets using, for example, TDM wireless communication standard. Circuit 100 can be fabricated in a power amplifier module in an integrated circuit ("IC"), for example.

As shown in FIG. 1, digital input signal ("VPK") 108 is coupled to pulse shaping circuit 102 and control logic circuit 104. VPK 108 has a square wave shape and is utilized to determine the peak voltage of analog output signal ("VOUT") 110 of pulse shaping circuit 102. Also shown in FIG. 1, transmit enable input signal ("TX ENABLE") 112 is coupled to control logic circuit 104 and also has a square wave shape. TX ENABLE 112 is utilized to initiate an up-ramp in pulse shaping circuit 102 when TX ENABLE 112 transitions from low to high, i.e. at the rising edge of TX ENABLE 112, and to initiate a down-ramp at a high to low transition, i.e. at the falling edge of TX ENABLE 112. TX ENABLE 112 is also utilized to determine the burst portion of VOUT 110. Control logic circuit 104 is coupled to pulse shaping circuit 102 and can be configured to provide appropriate digital timing signals for the operation of pulse shaping circuit 102.

Further shown in FIG. 1, start-up reference voltage ("VSTRT") 114 is coupled to pulse shaping circuit 102 and provides an initial start-up voltage that is used for generating VOUT 110. The value of VSTRT 114 is determined by the particular operating characteristics of power amplifier 106. Also shown in FIG. 1, pulse shaping circuit 102 is coupled to a power control input of power amplifier 106. Pulse shaping circuit 102 can be configured to receive VPK 108, VSTRT 114, and appropriate control signals from control logic circuit 104 and to generate VOUT 110, which has a ramp-up portion and ramp-down portion that has a shape that corresponds to a piece-wise-linear approximation of a sinusoid. As a result, VOUT 110, which is coupled to power amplifier 106, causes RF output signal ("RF OUT") 118 to have similarly shaped ramp-up and ramp-down portions.

Also shown in FIG. 1, RF input signal ("RF IN") 116 is coupled to the RF input of power amplifier 106, which can be configured to receive and amplify RF IN 116 and generate RF output signal ("RF OUT") 118. By way of example, power amplifier 106 can be a power amplifier in a wireless communication system, such as a wireless communication system using a TDM communication standard.

Figure 2:
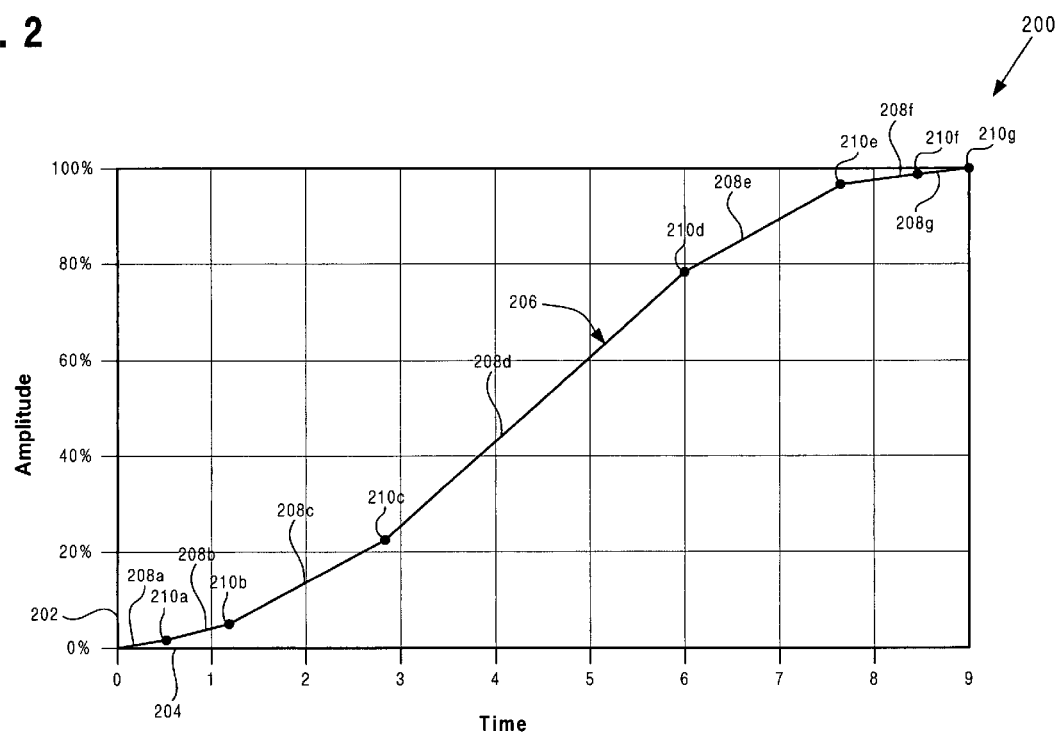
FIG. 2 is a graph showing a ramp curve in accordance with one embodiment of the present invention.

FIG. 2 shows exemplary graph 200 including an exemplary ramp curve in accordance with one embodiment of the present invention. Graph 200 includes amplitude axis 202, time axis 204, and ramp curve 206. In graph 200, amplitude axis 202 corresponds to the amplitude of VPK 108 in FIG. 1, which determines the amplitude of VOUT 110 of pulse shaping circuit 102 in FIG. 1, while time axis 204 corresponds to the duration of a ramp up of VOUT 110 from zero % amplitude of VPK 108 to 100% amplitude of VPK 108.

In graph 200, ramp curve 206 comprises linear segments 208a, 208b, 208c, 208d, 208e, 208f, and 208g, which form a piece wise linear ("PWL") approximation of a sinusoid, i.e. a sine wave. In the present embodiment, ramp-up curve 206 comprises seven segments. In another embodiment, ramp curve 206 may comprise a different number of segments. In the example shown in graph 200, points 210a, 210b, 210c, 210d, 210e, 210f, and 210g on ramp curve 206 correspond, respectively, to 1%, 5%, 24%, 76%, 95%, 99% and 100% of the final peak value of VOUT 110 in FIG. 1.

In the example shown in graph 200, linear segments 208a, 208b, 208c, 208d, 208e, 208f, and 208g have slope ratios of 1/16, 5/16, 10/16, 16/16, 10/16, 5/16, 1/16, respectively. The present invention's pulse shaping circuit, such as pulse shaping circuit 102 in FIG. 1, utilizes a number of separate current sources having cumulative weighting that matches the above slope ratios. These current sources are then utilized to charge an integration capacitor at charging rates that align with the respective slopes of segments 208a through 208g.

As a result, the present invention's pulse shaping circuit generates an analog output signal, such as VOUT 110, that ramps up to a peak voltage, where the ramp-up portion has a shape that corresponds to ramp curve 206, i.e. corresponds to a PWL approximation of a sinusoid. By reversing the above process as discussed below, the present invention's pulse shaping circuit also achieves an analog output signal, such as VOUT 110, having a ramp-down shape that corresponds to a PWL approximation of a sinusoid. The present invention's pulse shaping circuit is discussed in detail below in relation to FIG. 3.

Figure 3:
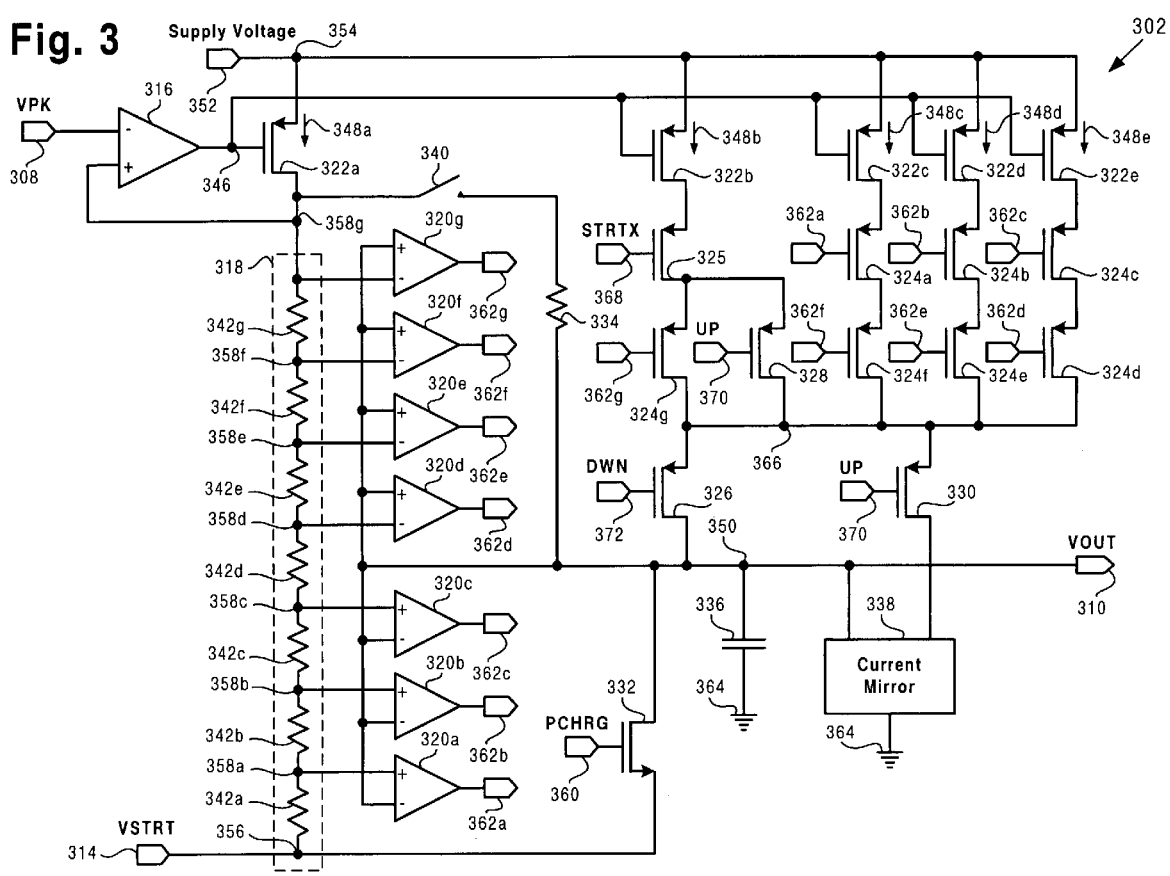
FIG. 3 illustrates a circuit diagram of an exemplary pulse shaping circuit in accordance with one embodiment of the present invention.

FIG. 3 shows a circuit diagram of an exemplary pulse shaping circuit in accordance with one embodiment of the present invention. Pulse shaping circuit 302 in FIG. 3 corresponds to pulse shaping circuit 102 in FIG. 1. Also, VPK 308, VOUT 310, and VSTRT 314 in FIG. 3 correspond, respectively, to VPK 108, VOUT 110, and VSTRT 114 in FIG. 1. Pulse shaping circuit 302 includes buffer 316, resistive divider 318, comparators 320a through 320g, transistors 322a through 322e, 324a through 324g, 325, 326, 328, 330, and 332, resistor 334, integration capacitor 336, current mirror 338, and switch 340. Resistive divider 318 includes resistors 342a through 342g. It noted that while P-channel field effect transistors ("PFET") and N-channel field effect transistors ("NFET") have been used as specific examples for the various transistors in pulse shaping circuit 302, one or more of such transistors can be bipolar transistors and/or other types of transistors.

As shown in FIG. 3, VPK 308 is coupled to an inverting input of buffer 316 and a noninverting input of buffer 316 is coupled to a first terminal of switch 340 and the drain of transistor 322a at node 358g. The output of buffer 316 is coupled to the gates of transistors 322a through 322e. The gates of transistors 322b through 322e are coupled to the gate of transistor 322a in current mirror configuration; that is, during operation, currents 348b through 348e of respective transistors 322b through 322e are mirrored currents of current 348a, which is drawn by transistor 322a, and are thus directly proportional to current 348a. Transistor 322a can be a PFET and can be configured to turn on and generate current 348a, which flows through resistive divider 318, when the output of buffer 316 transitions low, i.e. at the rising edge of VPK 308. Transistors 322b through 322e can be PFETs and are also referred to as "mirrored current sources" in the present application. In one embodiment, one or more of transistors 322a through 322e can comprise a number of PFETs coupled together in parallel, where each of the PFETs has a substantially similar size. For example, transistor 322a can comprise four parallel PFETs, transistor 322b can comprise one PFET, transistor 322c can comprise four parallel PFETs, transistor 322d can comprise five parallel PFETs, and transistor 322e can comprise six parallel PFETs.

In the present embodiment, transistors 322b, 322c, 322d, and 322e can be selected such that currents 348b, 348c, 348d, and 348e, which are also referred to as "mirrored currents" in the present application, are 25%, 100%, 125%, and 150% as large as current 348a, respectively. Thus, since the sum of currents 348b, 348c, 348d, and 348e, hereinafter referred to as "SUM" in the present application, is equal to 400% of current 348a, the ratio of current 348b/SUM is equal to 25%/400%, i.e. 1/16, which corresponds to the slope of linear segments 208a and 208g of ramp curve 206 in FIG. 2. Accordingly, the ratio of (current 348b+current 348c)/SUM is equal to 125%/400%, i.e. 5/16, which corresponds to the slope of linear segments 208b and 208f of ramp curve 206; the ratio of (current 348b+current 348c+current 348d)/SUM is equal to 250%/400%, i.e. 10/16, which corresponds to the slope of linear segments 208c and 208e of ramp curve 206; and the ratio of (current 348b+current 348c+current 348d+current 348e)/SUM is equal to 400%/400%, i.e. 16/16, which corresponds to the slope of linear segment 208d of ramp curve 206.

Buffer 316 can be configured to receive VPK 308, replicate the peak voltage of VPK 308 at node 358g, and drive transistors 322a through 322e. Buffer 316 can comprise an operational amplifier. Switch 340 can comprise a pass gate or other appropriate switching device and can be configured to close when the voltage on capacitor 336 at node 350 is substantially equal to the voltage at node 358g, i.e. the peak value of VPK 308. Also shown in FIG. 3, the sources of transistors 322a through 322e are coupled to supply voltage 352 at node 354. Supply voltage 352 may be a supply voltage having a constant DC voltage with no AC component, such as VDD.

Also shown in FIG. 3, a first terminal of resistive divider 318 is coupled to node 358g and a second terminal of resistive divider 318 is coupled to VSTRT 314 and the source of transistor 332 at node 356. The values of resistors 342a through 342g of resistive divider 318 can be selected such that nodes 358a through 358g correspond, respectively, to points 210a through 210g on ramp curve 206 in FIG. 2. Thus, the respective voltages at nodes 358a through 358g are substantially equal to 1%, 5%, 24%, 76%, 95%, and 100% of the voltage at node 358g, i.e. the peak voltage of VPK 308. Further shown in FIG. 3, the gate of transistor 332 is coupled to precharge ("PCHRG") 360 and the drain of transistor 332 is coupled to node 350. Transistor 332 can be an NFET and can be configured to turn on when PCHRG 360 transitions from low to high. PCHRG 360 is a control signal that can be configured to transition from low to high when VPK 308 transitions high and to low, i.e. at the rising edge of VPK 308, and to transition from high to low when TX ENABLE 112 in FIG. 1 transitions from high to low, i.e. at the falling edge of TX ENABLE.

Further shown in FIG. 3, the "+" terminals of comparators 320a, 320b, and 320c are coupled to respective nodes 358a, 358b, and 358c, the "−" terminals of comparators 320a, 320b, and 320c are coupled to node 350, and respective outputs 362a, 362b, and 362c of comparators 320a, 320b, and 320c are coupled to the gates of transistors 324a, 324b, and 324c. Comparators 320a, 320b, and 320c can be configured to provide a low output when the voltage on integration capacitor 336 at node 350 is less than the voltage at nodes 358a, 358b, and 358c, respectively, and to provide a high output when the voltage at node 350 is equal to or greater than the voltage at nodes 358a, 358b, and 358c.

Also shown in FIG. 3, the "+" terminals of comparators 320d, 320e, 320f, and 320g are coupled to node 350, the "−" terminals of comparators 320d, 320e, 320f, and 320g are coupled to respective nodes 358d, 358e, 358f, and 358g, and respective outputs 362d, 362e, 362f, and 362g of comparators 320d, 320e, 320f, and 320g are coupled to the gates of transistors 324d, 324e, 324f, and 324g. Comparators 320d, 320e, 320f, and 320g can be configured to provide a low output when the voltage on integration capacitor 336 at node 350 is less the voltage at nodes 358d, 358e, 358f, and 358g, respectively, and to provide a high output when the voltage at node 350 is equal to or greater than the voltages at nodes 358d, 358e, 358f, and 358g.

Also shown in FIG. 3, a second terminal of switch 340 is coupled to a first terminal of resistor 334 and a second terminal of resistor 334 is coupled to node 350. Resistor 334 in combination with integration capacitor 336 comprises an RC filter that prevents any noise in buffer 316 from being coupled to VOUT 310 at node 350 when switch 340 is closed. Further shown in FIG. 3, a first terminal of current mirror 338 is coupled to node 350, a second terminal of current mirror 338 is coupled to a drain of transistor 330, and a third terminal of current mirror 338 is coupled to ground 364. Current mirror 338 can comprise a pair of NFETs coupled in a current mirror configuration and can be configured to draw current from integration capacitor 336 to ground 364 when the second terminal of current mirror 338 is high Also shown in FIG. 3, a first terminal of integration capacitor 336 is coupled to node 350, a second terminal of integration capacitor 336 is coupled to ground 364, and VOUT 310 is outputted at node 350. Further shown in FIG. 3, the sources of transistor 324a, 324b, and 324c are coupled to the respective drains of transistor 322c, 322d, and 322e, the drains of transistor 324a, 324b, and 324c are coupled to the respective sources of transistors 324f, 324e, and 324d, and the drains of transistor 324f, 324e, and 324d are coupled to node 366. Also shown in FIG. 3, the gate of transistor 325 is coupled to STRTX 368, the source of transistor 325 is coupled to the drain of transistor 322b, and the drain of transistor 325 is coupled to the sources of transistors 324g and 328.

STRTX 368 is a control signal that can be configured to transition from high to low when VPK 308 transitions from low to high and visa versa. The drains of transistors 324g and 328 are coupled to node 366 and the gate of transistor 328 is coupled to UP 370. UP 370 is a control signal that can be configured to transition from high to low when TX ENABLE 112 in FIG. 1 transitions from high to low, i.e. at the falling edge of TX ENABLE 112, and visa versa. Thus, UP 370 transitions from high to low at the beginning of the generation of the down ramp portion of VOUT 310. Further shown in FIG. 3, the sources of transistors 326 and 330 are coupled to node 366, the respective drains of transistors 326 and 330 are coupled to node 350 and the second terminal of current mirror 338, and the respective gates of transistors 326 and 330 are coupled to DWN 372 and UP 370.

DWN 372 is a control signal that can be configured to transition from high to low when TX ENABLE 112 in FIG. 1 transitions from low to high, i.e. at the rising edge of TX ENABLE 112. Thus, DWN 372 transitions from high to low at the beginning of the generation of the up ramp portion of VOUT 310. Transistors 324a through 324g, 325, 326, 328, and 330 can be PFETs and are configured to operate as switches. In other embodiments, transistors 324a through 324g, 325, 326, 328, and 330 can comprises different types of transistors that are configured as switches or other types of switching devices. Control signals PCHRG 360, STRTX 368, UP 370, and DWN 372 can be generated by a control logic circuit, such as control logic circuit 104 in FIG. 1.

The operation of pulse shaping circuit 302 will now be discussed. When VPK 308 transitions from low to high, the voltage-to-current converter formed by buffer 316, transistor 322a, and resistive divider 318 causes current 348a to flow through transistor 322a, where current 348a is a function of VPK 308. The peak voltage of VPK 308 is replicated by buffer 316 at node 358g such that the voltages at nodes 358a through 358f correspond to respective points 210a through 210f of ramp curve 206 in FIG. 2. Current 348a is mirrored by four current sources, i.e. transistors 322b, 322c, 322d, and 322e, which generate respective currents 348b, 348c, 348d, and 348e, i.e. mirrored currents. At the rising edge of VPK 308, an initial start-up voltage, i.e. VSTRT 314, is applied to integration capacitor 336, transistors 324d, 324e, 324f, and 324g are turned on by respective comparators 320d, 320e, 320f, and 320g, and transistor 325 is turned on by STRTX 368.

The generation of the ramp-up portion of VOUT 310 starts when DWN 372 turns on transistor 326 at the rising edge of TX ENABLE 112 in FIG. 1, which couples transistor 322b to node 350 and causes current 348b to charge integration capacitor 336, thereby causing the voltage on integration capacitor 336 at node 350 to increase. Since the ratio of current 348b to SUM is 1/16, a segment of the ramp-up portion of VOUT 310 is generated at node 350 that corresponds to linear segment 208a of ramp curve 206 in FIG. 2, which has a slope of 1/16. When the voltage on integration capacitor 336 reaches the voltage level at node 358a, which corresponds to point 210a in FIG. 2, comparator 320a turns on transistor 324a, which couples transistor 322c to node 350 and causes current 348c to charge integrating capacitor 336 in addition to current 348b. Thus, since the ratio of (current 348b+current 348c)/SUM is 5/16, a segment of the ramp-up portion of VOUT 310 corresponding to linear segment 208b of ramp curve 206, which has a slope of 5/16 is generated at node 350.

In a similar manner, currents 348d and 348e are sequentially added to correspondingly increase the total current charging integration capacitor 336, which causes a corresponding increase in the voltage on integration capacitor 336. As a result, segments of the ramp-up portion of VOUT 310 are generated that correspond to linear segments 208c and 208d of ramp curve 206, which have respective slopes of 10/16 and 16/16. When the voltage on integration capacitor 336 reaches the voltage level at node 358d, which corresponds to point 210d of ramp curve 206, comparator 320d turns off transistor 324d, which decouples transistor 322e from node 350 and, thereby, turns off current 348e.

At this point in the process, the total current charging integration capacitor 336 includes currents 348b, 348c, and 348d, which have a ratio of 10/16 with respect to SUM. As a result, a segment of the ramp-up portion of VOUT 310 corresponding to linear segment 208e of ramp curve 206 is generated at node 350. In a similar manner, currents 348d and 348c are sequentially turned off to correspondingly decrease the total current charging integration capacitor 336 and to generate respective segments of the ramp-up portion of VOUT 310 that correspond to linear segments 208f and 208g of ramp curve 206. When the voltage on integration capacitor reaches the voltage level at node 358g, i.e. the peak voltage of VPK 308, the generation of the ramp-up portion of VOUT 310 is completed and comparator 320g causes switch 340 to close. As a result, the peak voltage level at node 358g is applied to integration capacitor 336, which holds the voltage on integration capacitor 336 to the peak voltage level while the burst portion of VOUT 310 is generated.

At the complete of the burst portion of VOUT 310, i.e. when TX ENABLE 112 in FIG. 1 transitions from high to low, switch 340 opens, transistor 326 turns off, and UP 370 transitions low and turns on transistor 330, which begins generation of the down-ramp portion of VOUT 310. During generation of the down-ramp portion of VOUT 310, the process utilized to generate the up-ramp portion of VOUT 310 discussed above is reversed. Instead of increasing the amount of current that is charging integration capacitor 336, current is pulled off integration capacitor 336 and routed to ground via current mirror 338. For example, transistors 324f, 324e, 324d are sequentially turned on to generate segments of the down-ramp portion of VOUT 310 that corresponds to respective linear segments 208f, 208e and 208d of ramp curve 206. Once the down-ramp has decreased in voltage to approximately 50% of the peak value of VPK 308, transistors 324c, 324b, and 324a are sequentially turned off to generate the segments of the down-ramp portion of VOUT 310 corresponding to respective linear segments 208c, 208b, and 208a of ramp curve 206. Thus, the ramp-up and ramp-down portions of VOUT 310 of pulse shaping circuit 302 have shapes that correspond to piece-wise-linear approximations of a sinusoid.

Thus, by sequentially controlling the amount of current that is charging or being drained off an integration capacitor, where the ratios of selected amounts of charging current or current being drain off to total mirrored current correspond to the slopes of linear segments of a curve that is a piece-wise-linear approximation of a sinusoid, the present invention's pulse shaping circuit advantageously achieves an analog output signal having ramp-up and ramp-down portions with shapes that correspond to piece-wise-linear approximations of a sinusoid. Additionally, the present invention's pulse shaping circuit achieves ramp-up and ramp-down portions of an analog output signal having shapes that correspond to piece-wise-linear approximations of a sinusoid without utilizing clock references, which are required by conventional pulse shaping circuits that utilize conventional DACs. As a result, the present invention's pulse shaping circuit does have clock references that can interfere with power amplifier RF functions.

Furthermore, the present invention's pulse shaping circuit can be easily combined with a power amplifier in a single IC. As a result, the present invention's pulse shaping circuit eliminates the need, as required by conventional DAC-based pulse shaping circuits, to tailor the output voltage waveform to match power amplifier variations, which undesirably increases product development time. Moreover, the present invention's pulse shaping circuit can be integrated with a power amplifier without requiring alias filtering, which is required for conventional DAC-generated waveforms.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, clockless pulse shaping circuit for controlling a power amplifier output has been described.

The invention claimed is:

1. A pulse shaping circuit comprising:
    a buffer configured to receive a digital input signal and generate a buffer output, said buffer output driving a plurality of current sources; and
    each of said plurality of current sources being configured to be selectively coupled to and selectively decoupled from a first node;
    wherein said plurality of current sources cause an analog output signal generated at said first node to have a ramp-up portion with a first shape corresponding to a piece-wise-linear approximation of a sinusoid.

2. The pulse shaping circuit of claim 1 further comprising a transistor coupled to said buffer, wherein said transistor is configured to cause said plurality of current sources to generate a plurality of mirror currents.

3. The pulse shaping circuit of claim 2 wherein said ramp-up portion comprises a plurality of segments, wherein each of said plurality of segments has a slope that is determined by one or more of said plurality of mirror currents.

4. The pulse shaping circuit of claim 1 wherein said analog output signal has a ramp-down portion having a second shape, wherein said second shape corresponds to said piece-wise-linear approximation of a sinusoid.

5. The pulse shaping circuit of claim 4 further comprising a comparator, said comparator having a first terminal coupled to integration capacitor and a second terminal coupled to a second node, wherein said comparator is configured to couple one of said plurality of current sources to said integration capacitor if a first voltage at said integration capacitor is equal to a second voltage at said second node.

6. The pulse shaping circuit of claim 4 further comprising a comparator, said comparator having a first terminal coupled to integration capacitor and a second terminal coupled to a second node, wherein said comparator is configured to decouple one of said plurality of current sources from said integration capacitor if a first voltage at said integration capacitor is equal to a second voltage at said second node.

7. The pulse shaping circuit of claim 1 wherein said pulse shaping circuit does not require a clock reference.

8. The pulse shaping circuit of claim 2 wherein said analog output signal is coupled to a power amplifier such that said analog output signal controls an RF output of said power amplifier.

9. The pulse shaping circuit of claim 2 wherein said buffer comprises an operational amplifier, said operational amplifier having an inverting input coupled to said digital input signal and a noninverting input coupled to a drain of said transistor.

10. The pulse shaping circuit of claim 1 wherein each of said plurality of current sources comprises a PFET.

11. A pulse shaping circuit comprising:
   a buffer configured to receive a digital input signal and generate a buffer output said buffer output driving a plurality of current sources;
   each of said plurality of current sources being configured to be selectively coupled to and selectively decoupled from a first node; and
   a transistor coupled to said buffer, wherein said transistor is configured to cause said plurality of current sources to generate a plurality of mirror currents;
   wherein said plurality of current sources cause an analog output signal generated at said first node to have a ramp-up portion with a first shape corresponding to a piece-wise-linear approximation of a sinusoid.

12. The pulse shaping circuit of claim 11 wherein said ramp-up portion comprises a plurality of segments, wherein each of said plurality of segments has a slope that is determined by one or more of said plurality of mirror currents.

13. The pulse shaping circuit of claim 11 wherein said analog output signal is coupled to a power amplifier such that said analog output signal controls an RF output of said power amplifier.

14. The pulse shaping circuit of claim 11 wherein said buffer comprises an operational amplifier, said operational amplifier having an inverting input coupled to said digital input signal and a noninverting input coupled to a drain of said transistor.

15. A pulse shaping circuit comprising:
   a buffer configured to receive a digital input signal and generate a buffer output, said buffer output driving a plurality of current sources;
   each of said plurality of current sources being configured to be selectively coupled to and selectively decoupled from a first node; and
   a comparator, said comparator having a first terminal coupled to an integration capacitor and a second terminal coupled to a second node, wherein said comparator is configured to couple one of said plurality of current sources to said integration capacitor if a first voltage at said integration capacitor is equal to a second voltage at said second node;
   wherein said plurality of current sources cause an analog output signal generated at said first node to have a ramp-up portion with a first shape corresponding to a piece-wise-linear approximation of a sinusoid, wherein said analog output signal has a ramp-down portion having a second shape, wherein said second shape corresponds to said piece-wise-linear approximation of a sinusoid.

* * * * *

UNITED STATES PATENT AND TRADEMARK OFFICE
CERTIFICATE OF CORRECTION

| | | |
|---|---|---|
| PATENT NO. | : 7,136,003 B1 | Page 1 of 1 |
| APPLICATION NO. | : 10/979967 | |
| DATED | : November 14, 2006 | |
| INVENTOR(S) | : Ripley et al. | |

It is certified that error appears in the above-identified patent and that said Letters Patent is hereby corrected as shown below:

In the claims, claim 1, column 8, line 56, reading "plurality of current sources; and" should read --plurality of current sources;--.

In the claims, claim 11, column 9, line 41, reading "generate a buffer output said buffer output driving a"
should read --generate a buffer output, said buffer output driving a--.

In the claims, claim 11, column 9, line 45, reading "from a first node; and" should read --from a first node;--.

In the claims, claim 15, column 10, line 28, reading "from a first node; and" should read --from a first node;--.

Signed and Sealed this

Seventeenth Day of July, 2007

JON W. DUDAS
*Director of the United States Patent and Trademark Office*